US009213051B2

(12) United States Patent
Kusumoto et al.

(10) Patent No.: US 9,213,051 B2
(45) Date of Patent: Dec. 15, 2015

(54) IMPEDANCE MEASUREMENT SYSTEM, IMPEDANCE MEASUREMENT METHOD AND PROGRAM

(75) Inventors: Manabu Kusumoto, Tokyo (JP); Masashi Kawakami, Tokyo (JP)

(73) Assignee: NEC CORPORATION, Tokyo (JP)

( * ) Notice: Subject to any disclaimer, the term of this patent is extended or adjusted under 35 U.S.C. 154(b) by 144 days.

(21) Appl. No.: 14/004,659

(22) PCT Filed: Jan. 12, 2012

(86) PCT No.: PCT/JP2012/050445
§ 371 (c)(1),
(2), (4) Date: Oct. 17, 2013

(87) PCT Pub. No.: WO2012/124359
PCT Pub. Date: Sep. 20, 2012

(65) Prior Publication Data
US 2014/0043039 A1    Feb. 13, 2014

(30) Foreign Application Priority Data

Mar. 17, 2011  (JP) ................................ 2011-058974

(51) Int. Cl.
*G01R 31/02* (2006.01)
*G01R 27/02* (2006.01)
*G01R 27/16* (2006.01)
*G01R 31/40* (2014.01)

(52) U.S. Cl.
CPC ................ *G01R 27/02* (2013.01); *G01R 27/16* (2013.01); *G01R 31/40* (2013.01)

(58) Field of Classification Search
CPC ......... G01R 27/02; G01R 27/16; G01R 31/40
See application file for complete search history.

(56) References Cited

U.S. PATENT DOCUMENTS

| 5,633,801 | A  | * | 5/1997  | Bottman ........................ 702/65  |
| 6,265,881 | B1 | * | 7/2001  | Meliopoulos et al. ........ 324/691 |
| 7,383,140 | B2 | * | 6/2008  | Paz et al. ........................ 702/65  |
| 7,629,795 | B2 | * | 12/2009 | Clunn ............................ 324/525 |

FOREIGN PATENT DOCUMENTS

| JP | 63-108284 A  | 5/1988  |
| JP | 6-347517 A   | 12/1994 |
| JP | 7-87007 A    | 3/1995  |
| JP | 2006-266814 A | 10/2006 |
| JP | 2007-265895 A | 10/2007 |
| JP | 2009-292282 A | 12/2009 |

OTHER PUBLICATIONS

International Search Report in PCT/JP2012/050445 dated Apr. 24, 2012 (English Translation Thereof).

* cited by examiner

*Primary Examiner* — Minh N Tang
(74) *Attorney, Agent, or Firm* — McGinn IP Law Group, PLLC.

(57) ABSTRACT

A condition input device inputs a measurement condition and the information of an electronic apparatus to be measured. A measurement operation program device selects a program that causes the electronic apparatus to perform an measurement operation based on the information of a measuring target object and the measurement condition. A voltage measurement device measures a voltage variation generated by the power source of the electronic apparatus. A wave form calculating device performs an arithmetic processing, such as a filtering processing or a time-frequency conversion (e.g. Fourier conversion) for the measured voltage variation to obtain the frequency characteristics of the voltage variation. An impedance calculating device calculates an impedance from the frequency characteristics of the voltage variation and the frequency characteristics of current and the condition of the measurement operation program.

20 Claims, 3 Drawing Sheets

IMPEDANCE MEASUREMENT SYSTEM, IMPEDANCE MEASUREMENT METHOD AND PROGRAM

TECHNICAL FIELD

The present invention relates to an impedance measurement system that measures an impedance of a power source of an electronic apparatus, an impedance measurement method of the impedance measurement system and a program thereof.

BACKGROUND ART

In recent years, with the rapid progress in semiconductor technology, the performance of an electronic apparatus that includes LSI (Large Scale Integration) or the like has been highly improved and the operation speed of the electrical apparatus becomes higher. With this improvement, the cost that is required for designing a power source of an electronic apparatus and performing operation test thereof increases. The quality and problems with respect to design of the power source in the electronic apparatus can be determined by measuring the impedance of the power source.

For example, a patent document 1 describes, for measuring an impedance of a power source of electrical equipment, a technique that measures an impedance based on a ratio of voltage-current generated from the power source in response to signals provided from a measurement apparatus to the power source.

DOCUMENT OF THE PRIOR ART

Patent Document

Patent Document 1: Japanese Unexamined Patent Application, First Publication, No. 2006-266814

DISCLOSURE OF INVENTION

Problems to be Solved by the Invention

When the quality of a power source is determined by measuring an impedance of a power source in an electronic apparatus, it is important to measure an impedance seen from an operating circuit in an operating state of the electronic apparatus. With respective to the power source, the voltage becomes stable when the impedance is maintained to be low to the operating circuit of the electronic apparatus that requires the power. Thereby, it is important to measure and evaluate the impedance seen from the side of the operating circuit requiring the power. In addition, as the impedance changes when an additional part is connected to the operating circuit of the electronic apparatus, it is important to measure the impedance under a similar condition to the operating condition of the electronic apparatus.

However, with respect to the technique described in patent document 1, when an impedance measurement is performed for an electronic apparatus, a transformer is inserted in series between a load and a power generator that is a measuring object, and using the transformer, a signal of alternating current is provided to the measuring object from the outside of the measuring object. In this way, when the signal is provided from the outside of the measuring object, the operation of the electronic apparatus and the impedance characteristic are affected, so that there is a problem that the impedance seen from the operating circuit of the electronic apparatus under the operating condition cannot be accurately measured.

In addition, for a case where a measuring object is such as an LSI, (Large-Scale Integration) which has microstructure covered with a package material, it is difficult to connect a signal source to the part of an operating circuit for measuring the impedance seen from the operating circuit, and thus the measurement itself was extremely difficult.

An object of the present invention is to provide an impedance measurement system, an impedance measurement method and a program thereof, which can solve the foregoing problem.

Problems to be Solved by the Invention

In order to solve the problem discussed above, the present invention is provided with an impedance measurement system that measures an impedance of a power source of an electronic apparatus. The impedance measurement system includes an input device configured to input information of the electronic apparatus and a measurement condition, a measurement operation program device configured to select a predetermined program that operates the electronic apparatus based on the information of the electronic apparatus and the measurement condition input from the input device and to execute the selected predetermined program by the electronic apparatus, a voltage measurement device configured to measure a voltage variation of the power source of the electronic apparatus while the predetermined program is executed by the measurement operation program device, a wave form calculating device configured to calculate frequency characteristics of voltage of the power source from the voltage variation of the power source measured by the voltage measurement device, an impedance calculating device configured to calculate an impedance from the frequency characteristics of the voltage of the power source calculated by the wave form calculating device and current characteristics of current generated when the predetermined program is executed by the measurement operation program device, and an output device configured to output the impedance calculated by the impedance calculating device.

In addition, in order to solve the problem described above, the present invention provides a program which causes an input unit to input information of the electronic apparatus and a measurement condition, a measurement operation program device to select a predetermined program that operates the electronic apparatus based on the information of the electronic apparatus and the measurement condition input from the input device and to execute the selected predetermined program by the electronic apparatus, a voltage measurement device to measure a voltage variation of the power source of the electronic apparatus while the predetermined program is executed by the measurement operation program device, a wave form calculating unit to calculate frequency characteristics of voltage of the power source from the voltage variation of the power source measured by the voltage measurement device, an impedance calculating unit to calculate an impedance from the frequency characteristics of the voltage of the power source calculated by the wave form calculating device and current characteristics of current generated when the predetermined program is executed by the measurement operation program device, and an output unit to output the impedance calculated by the impedance calculating unit.

An impedance measurement method that measures an impedance of a power source of an electronic apparatus, the impedance measurement method includes, an input step that inputs information of the electronic apparatus and a measurement condition, a measurement operation program selection step that selects a predetermined program that operates the electronic apparatus based on the information of the electronic apparatus and the measurement condition input in the input step and executes the selected predetermined program by the electronic apparatus, a voltage measurement step that measures a voltage variation of the power source of the electronic apparatus while the predetermined program is executed in the measurement operation program selection step, a wave form calculating step that calculates frequency characteristics of voltage of the power source from the voltage variation of the power source measured in the voltage measurement step, an impedance calculating step that calculates an impedance from the frequency characteristics of the voltage of the power source calculated in the wave form calculating step and current characteristics of current generated when the predetermined program is executed in the measurement operation program step, and an output step that outputs the impedance calculated in the impedance calculating step.

Effect of the Invention

In accordance with the present invention, it is possible to accurately measure an impedance seen from an operating circuit in an operating state of an electronic apparatus.

EMBODIMENTS FOR CARRYING OUT THE INVENTION

An embodiment of an impedance measurement system in accordance with the present invention will be described in detail below with reference to the drawings. In addition, in all drawings used to describe each embodiment, the identical element is given the identical symbol and its duplicate explanation for the identical symbol is neglected.

Figure 1:
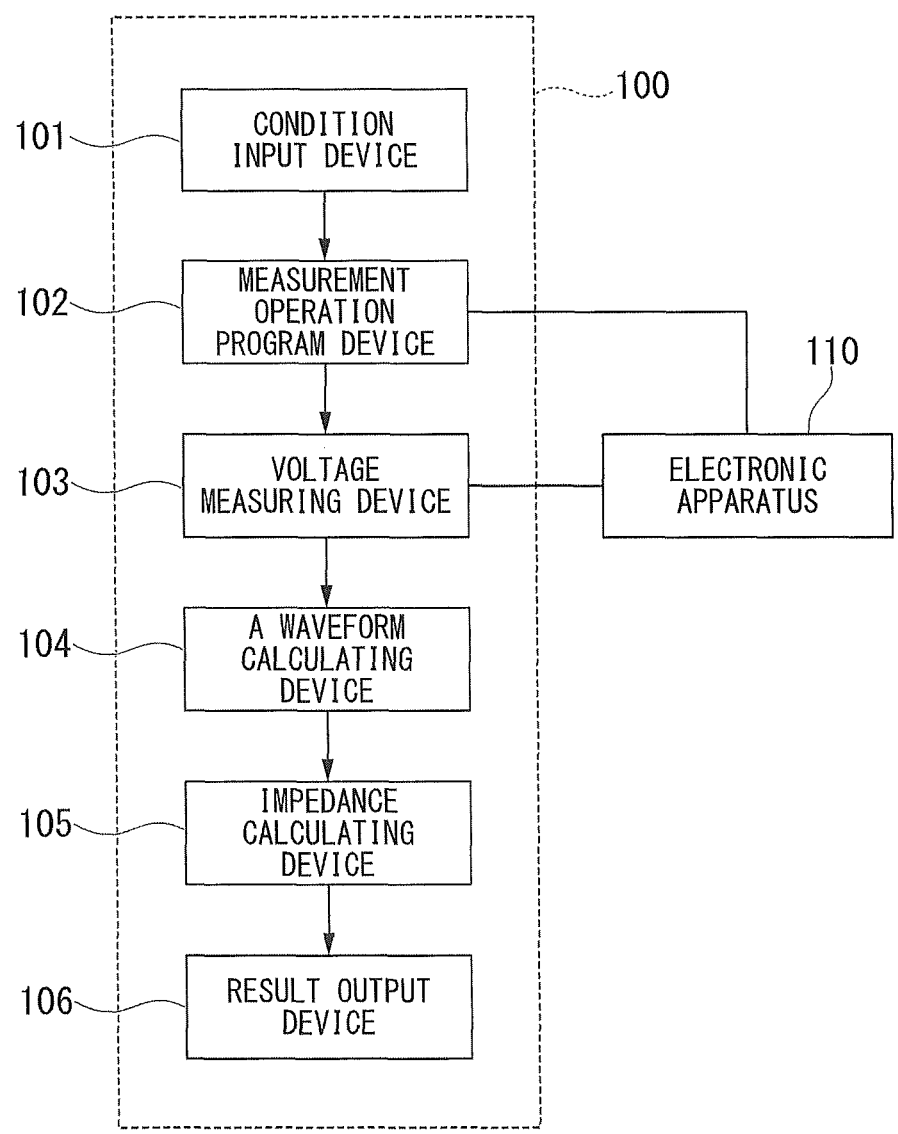
FIG. 1 is a block diagram illustrating a configuration of an impedance measurement system in accordance with an embodiment of the present invention.

FIG. 1 is a block diagram illustrating the configuration of the impedance measurement system in accordance with an embodiment of the present invention. As shown in FIG. 1, an impedance measurement system 100 includes a condition input device 101, a measurement operation program device 102, a voltage measuring device 103, a waveform calculating device 104, an impedance calculating device 105, and a result output device 106.

The condition input device 101 includes an input device such as a keyboard and a mouse, and receives input operations by a user. In particular, the condition input device 101 receives inputs with respect to the condition of a measurement and information on a measuring target electronic apparatus 110. For example, the condition input device 101 receives a frequency to be measured or the like as a measurement condition, and receives a type of applicable programs, an operation current value, a power source voltage value, an operation clock or the like as information of the measuring target electronic apparatus 110.

The measurement operation program device 102 selects a program that causes the measuring target electronic apparatus 110 to perform the measurement operation based on the measurement condition and the information of the measuring target electronic apparatus 110 input to the condition input device 101, and operates the electronic apparatus 110 with the program. With respect to the electronic apparatus 110, a current waveform is determined by an operating program. Therefore, a measurement operation program can cause the electronic apparatus 110 to generate a specific current waveform in response to the operation of the circuit.

The voltage measuring device 103 measures the voltage variation generated in the power source of the electronic apparatus 110 in response to the operation of the measurement operation program. The voltage measuring device 103 can be formed by configurations similar to, for example, a standard oscilloscope, an A/D convertor or the like.

The waveform calculating device 104 performs, for the measured voltage variation data (voltage waveform), filtering operations and arithmetic processing such as time-frequency conversion (e.g. Fourier transformation) or the like, and obtains the frequency characteristics of the voltage variation. Further, depending upon the measurement conditions, by performing the filtering operations (averaging operation or changing sampling rate) before or after the frequency-time conversion, the reduction of noise effects and the increase in the operation speed based on the reduction of the amount of arithmetic operations are performed, and the sampling rate required in the input conditions input to the condition input device 101 and the difference between the data length and the measurement condition of the voltage measuring device 103 are absorbed.

The impedance calculating device 105 calculates impedance (division of voltage by current) from the processed voltage waveform data (the frequency characteristics of voltage variations obtained by the waveform calculating device 104), the information (the frequency characteristics of current obtained from the measurement operation program device 102) of the electronic device 110 of a measuring target and a condition of the measurement operation program.

The result output device 106 outputs the calculated impedance. For example, the result output device 106 includes a display apparatus or a printer, so that the result output device 106 displays the impedance obtained based on calculation using the impedance calculating device 105.

Through the operations above, the impedance measurement system 100 in accordance with the present invention can measure the operation current of the electronic apparatus 110, that is, the impedance measurement system 100 can measure an impedance regarding the current flowed from an operation circuit as a signal source. Thereby, it is possible to measure impedance seen from the operation circuit.

Figure 2:
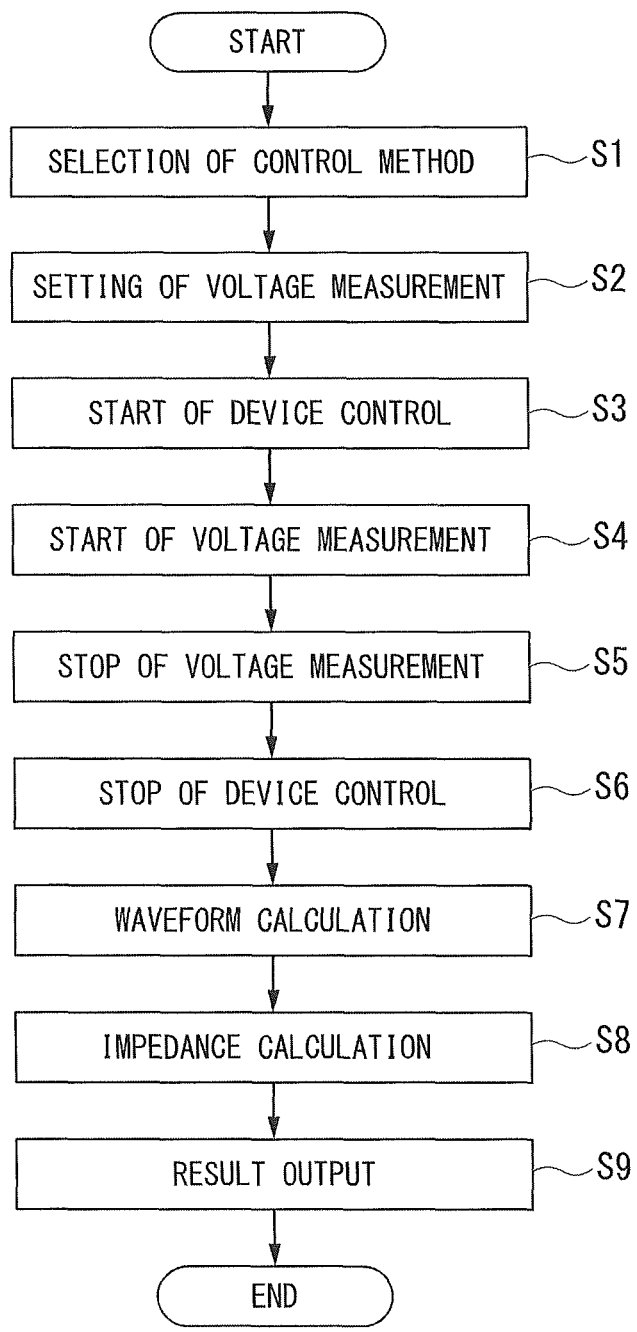
FIG. 2 is a flowchart describing the operation of the impedance measurement system in accordance with an embodiment of the present invention.

FIG. 2 is a drawing for illustrating the impedance measurement system in accordance with an embodiment of the present invention. In the present embodiment, an electronic apparatus 310 of a measurement target is regarded as a CPU board. First, the information of the electronic apparatus 110 of the measurement target and the information of the frequency characteristics to be measured are input from the input device 101. The type of a CPU and a clock frequency with a 100 MHz are input as the information. As the frequencies to be measured, the information about frequencies of 100 kHz~30 MHz are received.

Next, the measurement operation program device 102 selects, in response to the input information, a program (control method) that operates the electronic apparatus 110 (step S1). The measurement operation program device 102 stores programs that are executed in CPUs and the data of current that flows in the CPU corresponding to the electronic device 110 when the program is executed, so that the measurement operation program device 102 selects an appropriate program from them. In accordance with the present embodiment, a program that operates a CPU that corresponds to the inputted type of the CPU is selected.

Further, the voltage measuring device 103 performs the setting of voltage measurements (step S2). The voltage measuring device 103 includes a converter that performs A/D conversion of the source voltage of the electronic apparatus 110, in which the sampling rate of the A/D conversion is determined in response to the measured frequency inputted from the input device 101. In this case, a sampling frequency at 100 MHz is determined so that a Nyquist frequency satisfies the measurement condition of 30 MHz. In addition, a measurement time period is determined to be equal or more than 10 microsecond to obtain the data of the lowest measurement frequency at 100 kHz. Further, a measuring voltage range is determined based on the source voltage of a CPU board.

Further, the measurement operation program device 102 starts performing device control (step S3). More specifically, the measurement operation program device 102 transmits a program to the electronic apparatus 110 and causes the CPU corresponding to the electronic apparatus 110 to operate. Next, the voltage measuring device 103 measures a voltage variation caused by the operation of the CPU corresponding to the electronic apparatus 110 (step S4). In addition, the voltage measuring device 103 stops the voltage measurement when the determined measurement time period has elapsed (step S5).

Further, the measurement operation program device 102 stops performing the device control of the electronic apparatus 110 after the voltage measurement is finished (step S6). After that, the waveform calculating device 104 performs Fourier transformation with respect to the measured voltage waveform transmitted from the voltage measuring device 103, and calculates the frequency characteristics of the voltage variations (step S7). Subsequently, the impedance calculating device 105 acquires the frequency characteristics of the voltage variation calculated by the waveform calculating device 104 and the information (the frequency characteristics of the current obtained from the measurement operation program device 102) of the measurement operation program device 102, and calculates the impedance by dividing the voltage by the current (step S8). Further, the output device 106 outputs the result of the impedance calculation to a display, a printer or the like (step S9). After that, the operations in FIG. 2 are finished.

Figure 3:
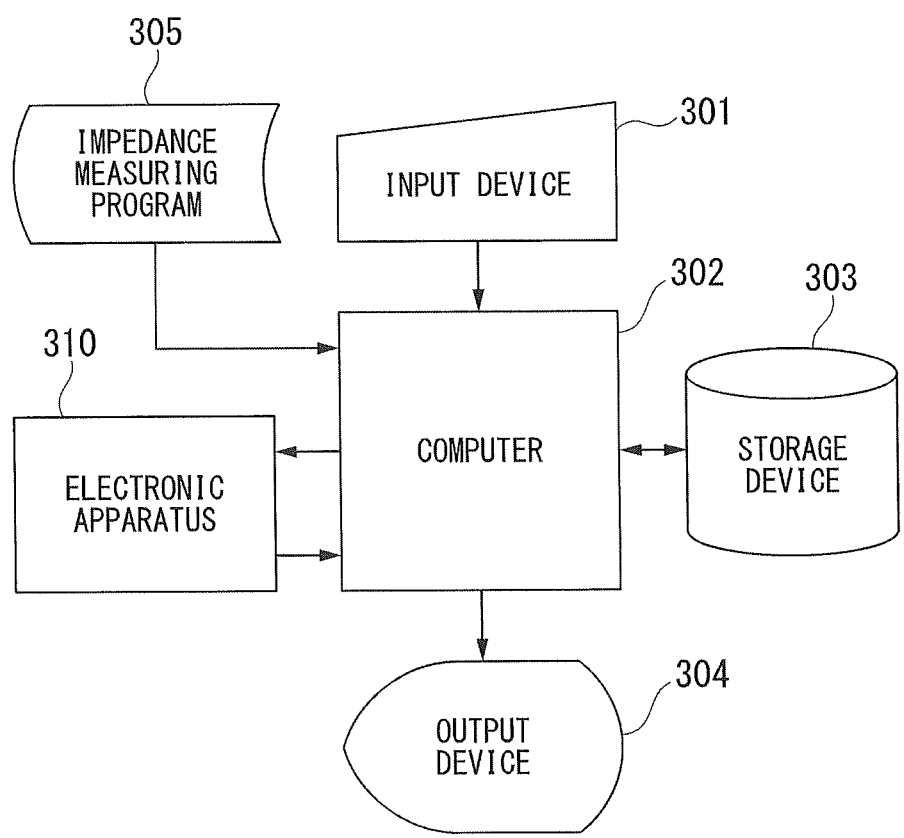
FIG. 3 is a block diagram illustrating a system configuration that forms the impedance measurement system in accordance with an embodiment of the present invention using a computer and a program.

FIG. 3 is a block diagram illustrating a system configuration that forms the impedance measurement system in accordance with an embodiment of the present invention using a computer and its program. In FIG. 3, the input device 1 corresponds to the condition input device 101 in FIG. 1, and includes a keyboard, a mouse being a pointing device, a trackball, a touch sensor or the like. The computer 301 includes a CPU, a various type of memories (RAM, ROM etc.), I/F or the like. By executing predetermined programs, the computer 301 causes the operations of the measurement operation program device 102 shown in FIG. 1, the voltage measuring device 103, the waveform calculating device 104, the impedance calculating device 105 and the like to operate.

The storage device 308, which is formed of an internal storage device or an external storage device, stores various kinds of data related to the execution of programs by the computer 302. The output device 304, which includes a monitor, a printer or the like, corresponds to the result output device 106 in FIG. 1. An impedance measurement program 305 is a program that is executed by the computer 302, which performs the operations indicated in the flowchart of FIG. 2. The electronic apparatus 310, which is a target apparatus to be measured, corresponds to the electronic apparatus 110 in FIG. 1.

In this way, it is possible to perform the present invention using a general computer (hardware and software) without using special devices.

In accordance with the embodiments described above, it is possible to cause an electronic apparatus to perform measurements, in which a circuit itself is regarded as a signal generation source and the voltage measurement is performed during operations of the electronic apparatus. Thereby, an impedance measurement seen from the operating circuit can be performed in an operating status of the electronic apparatus and an impedance value that determines the quality of the power source can be obtained. In addition, as the impedance seen from the operating circuit is obtained, it is possible to obtain the impedance characteristics of the inside of the operating apparatus.

In the foregoing, while an embodiment and a specific example have been explained with respect to the impedance measurement system in accordance with the present invention, the present invention is not limited to the above embodiments and the examples and it is possible to perform various modifications in the range of the subject matter without departing from the scope of the invention.

In addition, the impedance measurement method described above is achieved by a computer reading and executing the programs. Therefore, each process step of the foregoing impedance measurement method is stored into a computer readable recoding medium as the form of computer programs, and each of the above process steps can be performed by the computer reading and executing the programs. Here, the computer readable recording medium may be a magnetic disk, a magneto-optical disk, a CD-ROM, a DVD-ROM, or a semiconductor memory. Further, the programs may be distributed to an external computer via a telecommunication line and the external computer may execute the received program.

In addition, the foregoing program may be a program that executes part of the process steps of the foregoing impedance measurement method. Furthermore, the foregoing program may be a program that executes the process steps of the foregoing impedance measurement method by combining with another program that is already recorded in a computer system, i.e., a differential file (differential program).

In the above, the embodiments have been described in detail referring to the drawings, the specific configurations are not limited to the embodiments and may include design modifications and the like in the range without departing from the scope of the present invention.

Priority is claimed on Japanese Patent Application No. 2011-058974, filed Mar. 17, 2011, the content of which is incorporated herein by reference.

INDUSTRIAL APPLICABILITY

It is possible to provide an impedance measurement system that can measure an impedance seen from an operating circuit in the operating state of an electronic apparatus.

DESCRIPTION OF REFERENCE SYMBOLS

101 CONDITION INPUT DEVICE
102 MEASUREMENT OPERATION PROGRAM DEVICE
103 VOLTAGE MEASURING DEVICE
104 A WAVEFORM CALCULATING DEVICE
105 IMPEDANCE CALCULATING DEVICE
106 RESULT OUTPUT DEVICE
110 ELECTRONIC APPARATUS OF MEASURING TARGET
310 ELECTRONIC APPARATUS OF MEASURING TARGET
301 INPUT DEVICE
302 COMPUTER
303 STORAGE DEVICE
304 OUTPUT DEVICE
305 IMPEDANCE MEASURING PROGRAM

The invention claimed is:

1. An impedance measurement system that measures an impedance of a power source of an electronic apparatus, the impedance measurement system comprising:
   an input device configured to input information of the electronic apparatus and a measurement condition;
   a measurement operation program device configured to select a predetermined program that operates the electronic apparatus based on the information of the electronic apparatus and the measurement condition input from the input device and to execute the selected predetermined program by the electronic apparatus;
   a voltage measurement device configured to measure a voltage variation of the power source of the electronic apparatus while the predetermined program is executed by the measurement operation program device;
   a wave form calculating device configured to calculate frequency characteristics of voltage of the power source from the voltage variation of the power source measured by the voltage measurement device;
   an impedance calculating device configured to calculate an impedance from the frequency characteristics of the voltage of the power source calculated by the wave form calculating device and current characteristics of current generated when the predetermined program is executed by the measurement operation program device; and
   an output device configured to output the impedance calculated by the impedance calculating device,
   wherein the electronic apparatus comprises a Large-Scale Integration (LSI) board operated by the selected predetermined program.

2. The impedance measurement system as claimed in claim 1, wherein the wave form calculating device performs a filtering process before calculating the frequency characteristics of the voltage of the power source.

3. The impedance measurement system as claimed in claim 1, wherein the measurement operation program device stores the predetermined program that operates the electronic apparatus and the current characteristics of the current generated when the predetermined program is executed by the electronic apparatus.

4. The impedance measurement system as claimed in claim 1, wherein the voltage measurement device determines a sampling rate of A/D conversion, a measurement time, and a voltage measuring range based on the measurement condition input from the input device.

5. The impedance measurement system as claimed in claim 1, wherein the input information of the electronic apparatus comprises a type of a Central Processing Unit (CPU) and a clock frequency.

6. The impedance measurement system as claimed in claim 5, wherein the clock frequency is about 100 MHZ.

7. The impedance measurement system as claimed in claim 1, wherein, as frequencies to be measured, the input device provides information on frequencies in a range from 100 kHz to 30 MHz.

8. The impedance measurement system as claimed in claim 1, wherein the LSI board comprises a Central Processing Unit (CPU) board including a microstructure covered with a package material.

9. A non-transitory computer readable medium, in which a computer program is stored, the program causing a computer of an impedance measurement system to measure an impedance of a power source of an electronic apparatus, wherein the program causes:
   an input unit to input information of the electronic apparatus and a measurement condition;
   a measurement operation program device to select a predetermined program that operates the electronic apparatus based on the information of the electronic apparatus and the measurement condition input from the input device and to execute the selected predetermined program by the electronic apparatus;
   a voltage measurement device to measure a voltage variation of the power source of the electronic apparatus while the predetermined program is executed by the measurement operation program device;
   a wave form calculating unit to calculate frequency characteristics of voltage of the power source from the voltage variation of the power source measured by the voltage measurement device;
   an impedance calculating unit to calculate an impedance from the frequency characteristics of the voltage of the power source calculated by the wave form calculating device and current characteristics of current generated when the predetermined program is executed by the measurement operation program device; and
   an output unit to output the impedance calculated by the impedance calculating unit,
   wherein the electronic apparatus comprises a Large-Scale Integration (LSI) board operated by the selected predetermined program.

10. The non-transitory computer readable medium as claimed in claim 9, wherein the wave form calculating unit performs a filtering process before calculating the frequency characteristics of the voltage of the power source.

11. The non-transitory computer readable medium as claimed in claim 9, wherein the measurement operation program unit stores the predetermined program that operates the electronic apparatus and the current characteristics of the current generated when the predetermined program is executed by the measurement operation program unit.

12. The non-transitory computer readable medium as claimed in claim 9, wherein the voltage measurement unit determines a sampling rate of A/D conversion, a measurement time and a voltage measuring range based on the measurement condition input from the input unit.

13. The non-transitory computer readable medium as claimed in claim 9, wherein the input information of the electronic apparatus comprises a type of a Central Processing Unit (CPU) and a clock frequency.

14. The non-transitory computer readable medium as claimed in claim 13, wherein the clock frequency is about 100 MHZ.

15. The non-transitory computer readable medium as claimed in claim 9, wherein, as frequencies to be measured, the input device provides information on frequencies in a range from 100 kHz to 30 MHz.

16. The non-transitory computer readable medium as claimed in claim 9, wherein the LSI board comprises a Central Processing Unit (CPU) board including a microstructure covered with a package material.

17. An impedance measurement method that measures an impedance of a power source of an electronic apparatus, the impedance measurement method comprising:
   inputting information of the electronic apparatus and a measurement condition;
   selecting a predetermined program that operates the electronic apparatus based on the information of the electronic apparatus and the measurement condition input in the inputting input step and executes the selected predetermined program by the electronic apparatus;
   measuring a voltage variation of the power source of the electronic apparatus while the predetermined program is executed in the selecting the predetermined;
   a wave form calculating that calculates frequency characteristics of voltage of the power source from the voltage variation of the power source measured in the measuring the voltage variation;
   calculating an impedance from the frequency characteristics of the voltage of the power source calculated in the wave form calculating and current characteristics of current generated when the predetermined program is executed in the selecting the predetermined program; and
   outputting the impedance calculated in the calculating the impedance,
   wherein the electronic apparatus comprises a Large-Scale Integration (LSI) board operated by the selected predetermined program.

18. The impedance measurement method as claimed in claim 17, wherein the input information of the electronic apparatus comprises a type of a Central Processing Unit (CPU) and a clock frequency.

19. The impedance measurement method as claimed in claim 17, wherein, as frequencies to be measured, the input device provides information on frequencies in a range from 100 kHz to 30 MHz.

20. The impedance measurement method as claimed in claim 17, wherein the LSI board comprises a Central Processing Unit (CPU) board including a microstructure covered with a package material.

* * * * *